United States Patent [19]
Schmid

[11] Patent Number: 5,626,406
[45] Date of Patent: May 6, 1997

[54] INTEGRATED CHASSIS SLIDE ASSEMBLY

[75] Inventor: Hartmut Schmid, North Vancouver, Canada

[73] Assignee: Glenayre Electronics, Inc., Charlotte, N.C.

[21] Appl. No.: 382,620

[22] Filed: Feb. 2, 1995

[51] Int. Cl.⁶ .............................. A47B 88/00; A47B 81/00
[52] U.S. Cl. ............................ 312/334.28; 312/334.8; 312/334.46; 312/223.2; 312/334.47; 211/26; 361/679; 361/683; 361/724; 361/796
[58] Field of Search .................... 312/334.28, 223.2, 312/223.1, 223.6, 334.8, 334.47, 334.44; 361/679, 683, 724, 796; 211/26

[56] References Cited

U.S. PATENT DOCUMENTS

| | | |
|---|---|---|
| D. 291,636 | 9/1987 | Rechberg . |
| 1,071,006 | 8/1913 | Little ........................... 312/334.8 X |
| 3,133,768 | 5/1964 | Klakovich ................... 312/334.8 X |
| 4,331,369 | 5/1982 | Lazar et al. ................. 312/334.8 X |
| 4,423,914 | 1/1984 | Vander Ley . |
| 4,480,878 | 11/1984 | Leiper . |
| 4,610,487 | 9/1986 | Delmege et al. . |
| 4,662,761 | 5/1987 | Hoffman . |
| 4,749,242 | 6/1988 | Rechberg . |
| 4,932,792 | 6/1990 | Baxter . |
| 4,976,388 | 12/1990 | Coontz . |
| 4,988,214 | 1/1991 | Clement . |
| 4,998,828 | 3/1991 | Hobbs . |
| 5,033,805 | 7/1991 | Hobbs . |
| 5,118,781 | 6/1992 | Wojcik ...................... 312/334.44 X |
| 5,181,782 | 1/1993 | Wojcik ...................... 312/334.44 X |
| 5,248,195 | 9/1993 | Shin . |
| 5,316,389 | 5/1994 | Hoffman . |
| 5,356,207 | 10/1994 | Röck et al. ..................... 312/334.46 |

*Primary Examiner*—Peter M. Cuomo
*Assistant Examiner*—Rodney B. White
*Attorney, Agent, or Firm*—Christensen O'Connor Johnson & Kindness, PLLC

[57] ABSTRACT

An integrated chassis slide assembly (10) is provided for integration with a chassis (12) and coupling to a mounting rack (not shown). The integrated chassis slide assembly (10) includes a fixed slide (14) coupled to the mounting rack (not shown), at least one intermediate slide (16), and an integrated chassis slide (18), where the integrated chassis slide is attached to the chassis (12) and forms a side panel of the chassis. The top and bottom edges of both the intermediate slide (16) and the integrated chassis slide (18) are bent over and outward to form opposed U-shaped channels (86, 106), and all the slides are slidably interlocked in a nested fashion, with the top and bottom edges of the fixed slide (14) nested within the channels (86) of the intermediate slide (16), and the channels of the intermediate slide nested within the channels (106) of the integrated chassis slide (18). Such interconnection allows for easy extension and retraction of the chassis along the assembly slides.

9 Claims, 4 Drawing Sheets

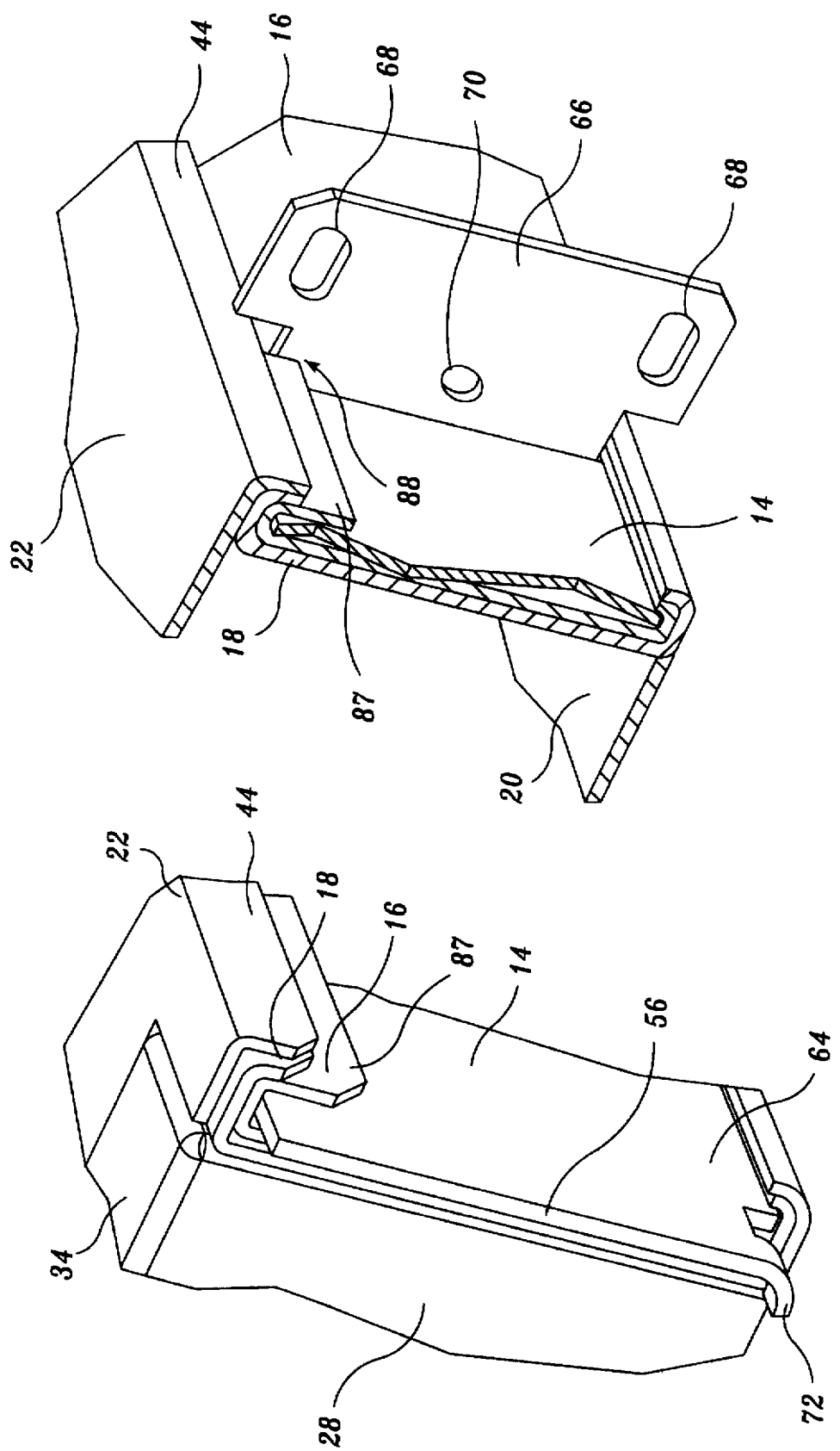

INTEGRATED CHASSIS SLIDE ASSEMBLY

FIELD OF THE INVENTION

The present invention generally relates to chassis for electronic and data processing equipment and, more specifically, to slide assemblies for such chassis.

BACKGROUND OF THE INVENTION

A wide variety of multipart slide assemblies have been developed to support a drawer within a cabinet so as to permit the supported drawer to be fully withdrawn from the cabinet. Such telescoping slide assemblies typically comprise nested slide elements with one slide fixed to a cabinet, one slide mounted to a drawer, and one or more intermediate slides slidingly interfitted with both the cabinet and drawer slides. It is also known to use a variety of locks, latches, and release mechanisms interconnected with the slides so that extension or retraction of the slide members relative to each other is controlled or restricted.

The need for telescoping sliding assemblies of this type is especially critical in the electronic and data processing field, where electronic equipment is frequently housed on chassis that are attached to mounting racks. Electronic component chassis may be single or multiple. Multiple chassis are usually stacked to create system banks. Installing electronic components requires initially coupling an equipped chassis to a mounting rack. Servicing the electronic components requires retrieving the chassis from the mounting rack and accessing some or all of the mounted electronic components. Replacing the electronic components requires completely removing the existing chassis and replacing it with a new, fully equipped chassis. For all of these procedures, easy access to the entire chassis, including the ability to install, retrieve, and remove the chassis from its mounting rack, leads to simpler, quicker, more efficient, and more cost-effective system maintenance, and suggests the use of chassis slide assemblies. An acceptable chassis slide assembly should enable complete withdrawal of an equipped chassis from its mounting rack, and provide simple installation and replacement of equipped chassis and easy access to all chassis electronic components for servicing procedures.

Unfortunately, the use of traditional slide assemblies in this context is ineffective in meeting the needs of the industry. Coupling add-on slides to existing and replacement chassis and mounting racks is time consuming as well as expensive. Finding slide assembly components compatible with different chassis and mounting racks often proves difficult, and replacing damaged or defective slide assembly components is often impossible. Furthermore, in light of the premium on space in tightly constructed electronic equipment chassis, it is frequently difficult to adapt even bulky slide assemblies to existing chassis and mounting racks. As a result of the cost and logistical problems associated with incorporating such slide assemblies into these specifically designed electronic equipment chassis, adequate chassis slide assemblies have not been available.

Thus, there is a need, particularly in the electronic and data processing field, for a low-cost slide assembly that is simple and quick to implement and that meets the space requirement for electronic equipment chassis and mounting racks, while still being fully extendable and providing the benefit of easy accessibility. The present invention is directed to fulfilling some of this need.

SUMMARY OF THE INVENTION

In accordance with the present invention, a slide assembly integrated with a chassis and suitable for coupling to a mounting rack is provided. More specifically, a chassis slide assembly is integrated with and supports a chassis having a base, a cover, and a front panel. The integrated chassis slide assembly includes a fixed slide coupled to a mounting rack, at least one intermediate slide, and an integrated chassis slide. The integrated chassis slide is integral with the chassis, attached to the base of the chassis, and forms a side panel of the chassis. The slides are of substantially equal length and each of the slides has front and back edges, top and bottom edges, and inside and outside faces. The top and bottom edges of both the intermediate slide and the integrated chassis slide are bent over and outward to form opposed U-shaped channels. The slides are slidably interlocked. Specifically, the opposed U-shaped channels of the intermediate slide slidably interlock with the top and bottom edges of the fixed slide, so that the outside face of the intermediate slide abuts the inside face of the fixed slide. In an analogous fashion, the opposed U-shaped channels of the integrated chassis slide slidably interlock with the opposed U-shaped channels of the intermediate slide, so that the outside face of the integrated chassis slide abuts the inside face of the intermediate slide. Such interconnection allows for easy extension and retraction of the chassis along the assembly slides. Specifically, the intermediate slide forms a bridge between the fixed slide and the chassis slide that allows the chassis to be substantially entirely withdrawn from a mounting rack when the slide assembly is fully extended.

In accordance with further aspects of this invention, the fixed slide includes an angled notched tab near the junction of the top and back edges and a mounting ear located at the front edge, the intermediate slide includes a step in at least one channeled edge, and the integrated chassis slide includes a coupling ear at the front edge. The mounting ear is used to mount the fixed slide to the mounting rack and to couple the fixed slide to the coupling ear of the integrated chassis slide. The mounting ear, in combination with the step in the channel of the intermediate slide and in conjunction with the angled notched tab of the fixed slide, restricts the slidable movement of the intermediate slide in both the forward and backward directions, respectively. The coupling ear of the integrated chassis slide restricts the forward movement of the fixed and intermediate slides in the forward direction.

In accordance with still other aspects of this invention, the intermediate slide includes a hole centrally located near the front èdge and the integrated chassis slide includes a locking tab formed by a notch cut into the integrated chassis slide having a latch mounted on the outside of the notch and abutting the inside face of said intermediate slide. The locking tab is shaped to fit and interlock with the hole of the intermediate slide such that the forward slidable movement of the intermediate slide in the extended direction is restricted beyond the point at which the locking tab snaps into the hole.

As will be appreciated from the foregoing summary, the invention's integration of the chassis slide assembly with the chassis provides a fully extendable chassis slide assembly suitable for use with electronic and data processing equipment. In particular, by integrating the chassis slide assembly with the chassis, by making a side panel of the chassis also function as one of the slides in the slide assembly, the invention provides the benefits of a traditional slide assembly, namely, easy access to the entire drawer, while adhering to the space requirements of electronic system chassis arrangements. Servicing the electronic components in the chassis is facilitated by easy access. In a similar fashion, the integrated nature of the slide assembly, in conjunction with the, lock-and-release mechanism, makes installation and replacement of the equipped chassis simple and quick. The entire chassis can easily be installed or replaced, simply by removing the entire old chassis if needed and inserting the new chassis, interlocking the integrated chassis slides of the new chassis with the other integrated chassis slide assembly elements. Finally, because the slide assembly is integrated with the chassis, there is no cost or time expended adapting existing chassis slide assemblies to a chassis.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 is a fragmented perspective view of the back of the integrated chassis slide assembly;

FIG. 3 is a cutaway perspective view of a portion of the outside of the integrated chassis slide assembly;

DETAILED DESCRIPTION OF THE PREFERRED EMBODIMENT

Figure 1:
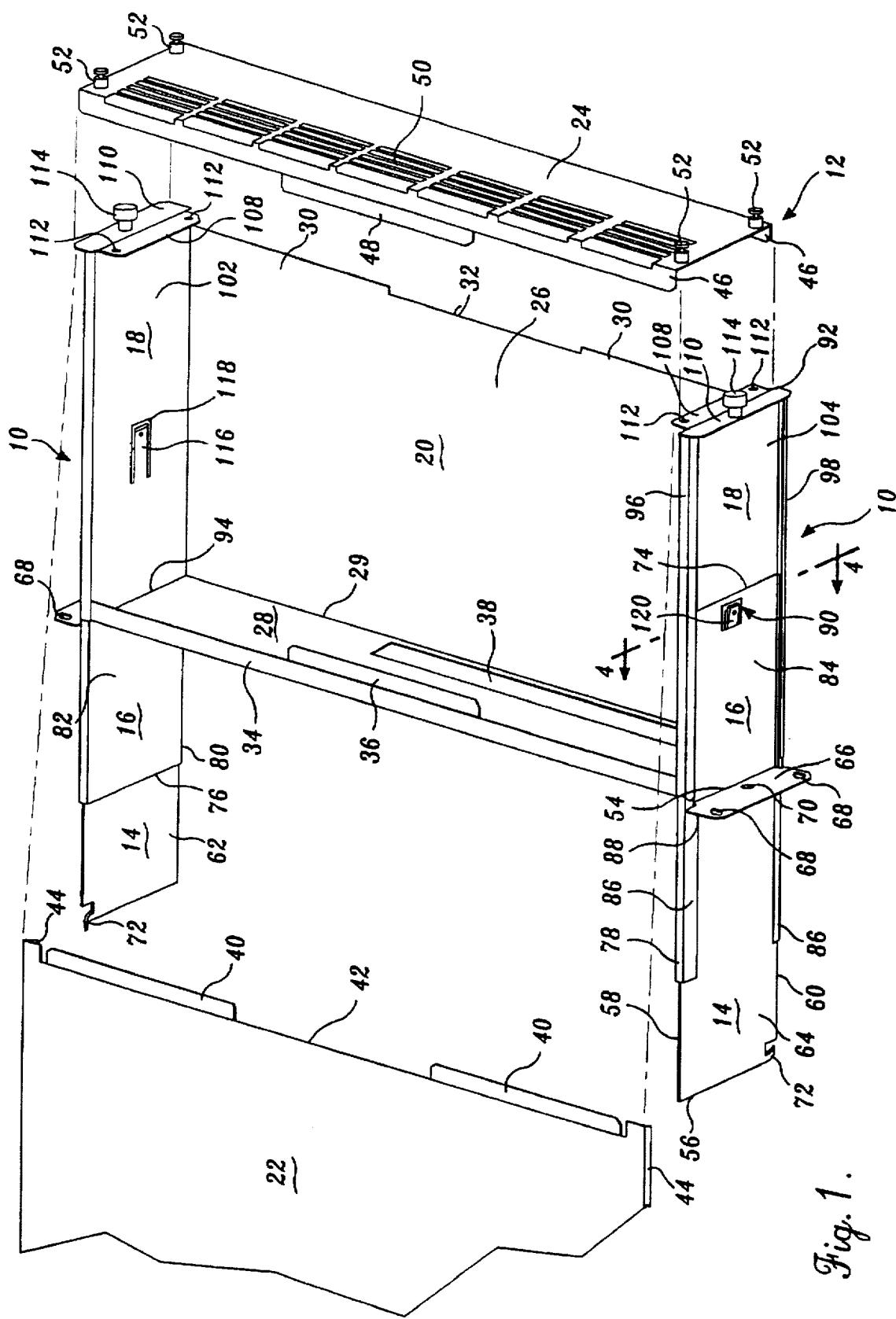
FIG. 1 is a perspective view of one embodiment of an integrated chassis slide assembly and an associated chassis made in accordance with the principles of the present invention.
Figure 4:
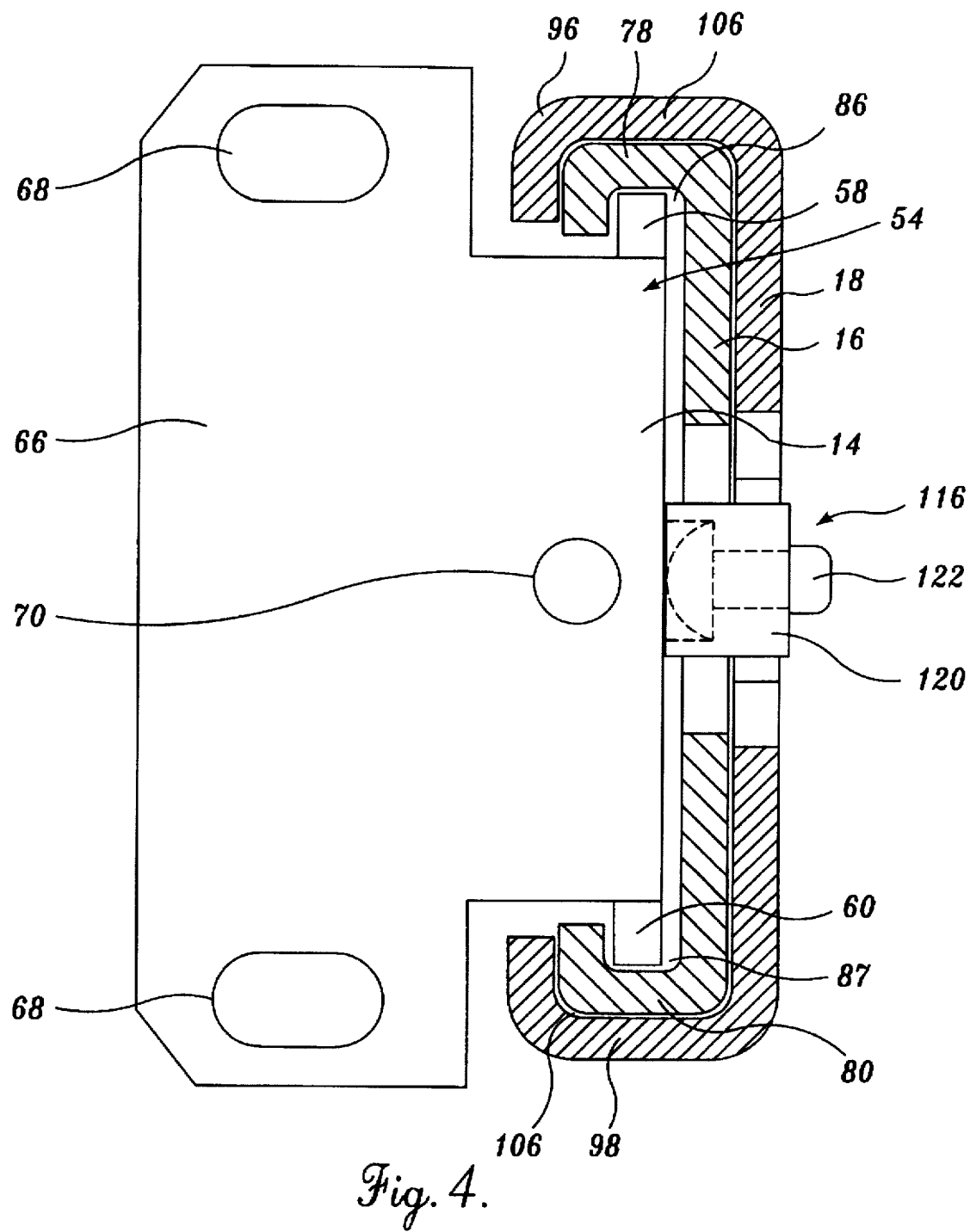
FIG. 4 is a cross-sectional view of the integrated chassis slide assembly, taken along section line 4—4 of FIG. 1.

An integrated chassis slide assembly for integration with a chassis made in accordance with the present invention is illustrated by FIGS. 1–5. As more specifically illustrated in FIG. 1, the preferred embodiment of the present invention includes two integrated chassis slide assemblies 10 integrated with and separated from each other by a chassis 12. The integrated chassis slide assemblies are identical to each other in every respect save their orientation relative to each other and the chassis; each chassis assembly comprises a fixed slide 14, an intermediate slide 16, and an integrated chassis slide 18, all of substantially equal length.

The chassis 12 with which the integrated chassis slide assemblies 10 are integrated includes a base 20, a cover 22, and a front panel 24. The base 20 is generally L shaped, forming two distinct perpendicular surfaces, namely, a chassis bottom panel 26 corresponding to the lower leg of the L-shaped base and a chassis back panel 28 corresponding to the shorter leg of the L-shaped base, merged at an L-joint 29 so as to define the lower rear corner of the chassis. The bottom panel 26 extends from this lower rear corner forward toward the front of the chassis 12, and has at its foremost edge two tabs 30, extending beyond the foremost edge of the bottom panel, and defining a space 32 centrally located between the tabs. The back panel 28 extends away from the bottom panel 26 at a tight angle with respect to the bottom panel. At its edge, farthest from the bottom panel 26, the back panel 28 bends forward, forming a lip 34, parallel to the bottom panel, and running the width of the base 20. A single tab 36, centrally located along the back panel 28 and extending forward beyond the edge of the lip 34, is affixed to the bottom of the lip 34. An aperture 38 is formed in the back panel 28, providing a path for cooling air to circulate throughout the chassis. The size of the aperture 38 may vary, and in alternate embodiments the aperture may extend the full width of the back panel 28 and/or may be formed in either the upper half or the lower half of the back panel.

The cover 22 of the chassis 12 is designed to be easily removable and is roughly the same dimensions as the bottom panel 26. Two tabs 40 are affixed to the bottom of cover 22 at both its front and back edges (only the front edge is shown). The tabs 40 extend beyond their respective edges of the cover and define space 42 centrally located between the tabs. The space between the tabs affixed to the back edge of the cover (not shown) corresponds to the width of the tab 36 of the back panel 28. The tabs 40 affixed to the cover correspond to the distance between the tab 36 of the back panel 28 and the ends of the lip 34 of the back panel. This sizing allows the cover to be slid into place against the back panel. When in this position, the tab 36 of the back panel underlies the cover 22 and the tabs 40 located along the back edge of the cover (not shown) underlie the lip 34 of the back panel 28. The remaining two edges of the cover are defined by bent lips 44, formed perpendicular to the cover and extending below the cover toward the base 20.

The front panel 24 is defined at its top and bottom edges by lips 46 formed perpendicular to the front panel that extend toward the back panel 28 of the base 20. Centrally located on each of these lips 46 and extending beyond the lips and toward the back panel 28 are tabs 48 (only the top tab is shown). The width of the panel tabs 48 corresponds to the width of the space 32 between the tabs 30 of the bottom panel 26 and the width of the space 42 between the tabs 40 of the cover 22. This sizing allows the front panel 24 to be inserted at the front of the chassis 12. When suitably positioned, the tab 48 of the top lip of the front panel 24 underlies the cover 22, the tabs 40 located along the front edge of the cover underlie the top lip of the front panel 24, the tab 48 of the bottom lip of the front panel (not shown) lies atop the base 20, and the tabs 30 of the base 20 lie atop the lower lip 46 of the front panel.

The front panel 24 also includes a series of vents 50 that provide ventilation for electrical components (not shown) located in the interior of the chassis 12. Finally, four mounting screws 52 are provided, one located in each of the four corners of the front panel 24, for affixing the front panel to the chassis slide assemblies 10 as they are integrated with the chassis 12 in the manner described below.

It should be noted that the actual design of the chassis 12 is very versatile, and in alternate embodiments where the chassis is designed for different applications the actual chassis components may vary. In one embodiment, the front panel 24 may not be removable. In another embodiment, the cover 22 and the back panel 28 merge to form a single component. In yet another embodiment of the chassis 12, both the front panel 24 and the back panel 28 are separate components and independently removable. The key fact is that the integrated chassis slide assembly described below has application with a wide range of chassis designs.

As both integrated chassis slide assemblies are identical in all aspects save orientation, the structure and function of only a single integrated chassis slide assembly will be hereinafter described. The fixed slide 14 of the integrated chassis slide assembly 10 has a front edge 54, a back edge 56, a top edge 58, a bottom edge 60, an inside face 62, and an outside face 64. As more clearly shown by reference to FIGS. 3, 4, and 5, the front edge 54 of the fixed slide 14 bends outward away from the inside face 62 to form a mounting ear 66 that lies perpendicular to the faces of the fixed slide. The mounting ear 66 includes two holes 68 for attaching the integrated chassis slide assembly and associated chassis to a stable support, such as a mounting rack (not shown). A third hole 70 is provided for coupling the fixed slide 14 to other components of the integrated chassis slide assembly 10 in the manner described below. As shown more fully in FIG. 2, the fixed slide 14 also includes a notched tab 72 located near the back edge 56. The notched tab 72 is a tab formed by a notch bent so as to be angled inward and away from the outside face 64 of the fixed slide.

The intermediate slide 16 has a front edge 74, a back edge 76, a top edge 78, a bottom edge 80, an inside face 82, and an outside face 84. As more clearly shown in FIGS. 2 and 4, the top edge 78 and the bottom edge 80, respectively, are bent over and outward from the inside face 82 of the intermediate slide to form opposed (top and bottom) U-shaped channels 86. The top and bottom U-shaped channels 86, respectively, encompass and slidably engage the top edge 58 and the bottom edge 60 of the fixed slide 14. The fixed slide is thereby slidably nestled within the channels 86 of the intermediate slide such that the outside face 84 of the intermediate slide abuts the inside face 62 of the fixed slide. The U-shaped channel 86 formed by the top edge 78 of the intermediate slide 16 extends downward toward the bottom edge 80 and parallel to the outside face 84 beyond the remaining length of the channel from the approximate midpoint of the intermediate slide backward to the back edge 76 of the intermediate slide, creating an extended lip 87. As shown in FIG. 3, the extended lip 87 creates a step 88 in the top channel. The extended lip extends downwardly by an amount sufficient to abut the mounting ear 66 of the fixed slide 14. This abutment limits the extent to which the intermediate slide 16 can extend outwardly with respect to the fixed slide 14. Finally, the intermediate slide 16 also includes a square hole 90 centrally located between the top edge 78 and the bottom edge 80 of the intermediate slide near the front edge 74.

The integrated chassis slide 18 has a front edge 92, a back edge 94, a top edge 96, a bottom edge 98, an inside face 102, and an outside face 104. The integrated chassis slide is integral with or affixed to the base 20 of the chassis 12 along the back edge 94 and the bottom edge 98. So integrated and affixed, the integrated chassis slide forms the side panel of the chassis 12 and, in conjunction with the base 20, the cover 22, and the front panel 24, completes the enclosure of the chassis. As more clearly shown in FIGS. 2 and 4, the top edge 96 and the bottom edge 98 of the integrated chassis slide 18, respectively, are bent over and outward, away from the inside face 102, to form opposed (top and bottom) U-shaped channels 106. These channels are nested within and interlock with the bent lips 44 of the cover 22, and these top and bottom channels 106 in turn encompass and slidably engage the top edge 78 and the bottom edge 80, respectively, of the intermediate slide 16. So interlocked, the outside face 104 of the integrated chassis slide 18 abuts the inside face 82 of the intermediate slide 16.

The front edge 92 of the integrated chassis slide 18 is bent orthogonally inward, away from the outside face 104, forming a coupling ear 108. Affixed to the coupling ear is a mounting plate 110. The mounting plate lies in the same plane as the coupling ear, on the inside of the integrated chassis slide, and extends beyond the outside face 104 and the channels 106 of the integrated chassis slide. Two apertures 112 formed in each of the coupling ears 108 are positioned to correspond to and receive the mounting screws 52 of the front panel 24, which are used to attach the front panel to the integrated chassis slide and chassis. The mounting plate 110 supports a single, centrally located coupling screw 114 that corresponds to the coupling aperture 70 of the fixed slide 14, and provides for the integrated chassis slide 18 and associated chassis 12 to be stably coupled to the fixed slide, and thus a mounting rack (not shown).

The integrated chassis slide 18 further includes a locking tab 116 formed by a horizontally oriented, rearwardly projecting U-shaped notch 118 cut into the integrated chassis slide. As more particularly shown in FIG. 5, the locking tab has a wedge-shaped latch 120 mounted on the outside face 104 of the notch 118 so as to abut the inside face 82 of the intermediate slide 16. The latch is affixed to the notch 118 by a rivet 122 centrally located in the latch. The latch is preferably made of an inexpensive plastic material and oriented to slope toward the back end of the chassis slide 18 at its back end. Thus, the wedge-shaped latch gradually increases in thickness, to its thickest point at its front end, where it forms a flat face 123. The latch is held in place on the notch 118 to prevent rotation around the rivet 122 by a nose 124 that extends beyond the inside face 102 of the chassis slide 18 along the front edge of the notch. The locking tab 116 forms a depressable spring latch that is biased toward the inside face 82 of the intermediate slide 16. The shape and position of the locking tab 116 are such that it corresponds to the square hole 90 of the intermediate slide 16.

With the elements of the integrated chassis slide assembly and associated chassis fully described, the operation of the chassis slide assembly 10 can more fully be appreciated. The intermediate slides 16 are initially slidably interlocked with the fixed slides 14 by inserting the fixed slides into the channels 86 of the intermediate slides. Once interlocked, the notched tabs 72 can be bent inward by application of an external force. As more specifically shown in FIG. 2, the resulting angled notched tab 72 overlaps and interferes with the movement of the intermediate slides with respect to the fixed slides, thereby restricting the movement of the intermediate slides backward beyond the fixed back edges 56 of the fixed slides. In a similar fashion, and as more clearly shown by reference to FIG. 3, the forward motion of the intermediate slides 16 is restricted by contact of the steps 88 of the intermediate slides with the mounting ears 66 of the fixed slides.

The integrated chassis slide assembly 10 and the associated chassis 12, complete with the base 20 and the integrated chassis slides 18, the cover 22 interlocked with the integrated chassis slides, and the front panel 24 mounted to the integrated chassis slides, can be inserted between the intermediate slides 16 interlocked with the fixed slides 14. As more clearly understood by reference to FIG. 4, this is accomplished by slidably inserting the channels 106 of the integrated chassis slides 18 over the channels 86 of the intermediate slides, such that the channels 106 of the integrated chassis slides encompass and interlock with the channels 86 of the intermediate slides, which in turn encompass and interlock with the edges of the fixed slides 14. The integrated chassis slide assembly 10 and the associated chassis 12 can be inserted and pushed toward the back edges 56 of the fixed slides 14 until the mounting plates 110 contact the front edges 74 and 54, respectively, of the intermediate slides and the fixed slides. Use of the coupling screws 114 at this point, in conjunction with coupling apertures 70 located in the mounting ears 66 of the fixed slides, firmly locks the integrated chassis slide assembly and the associated chassis to the fixed slides.

Figure 5:
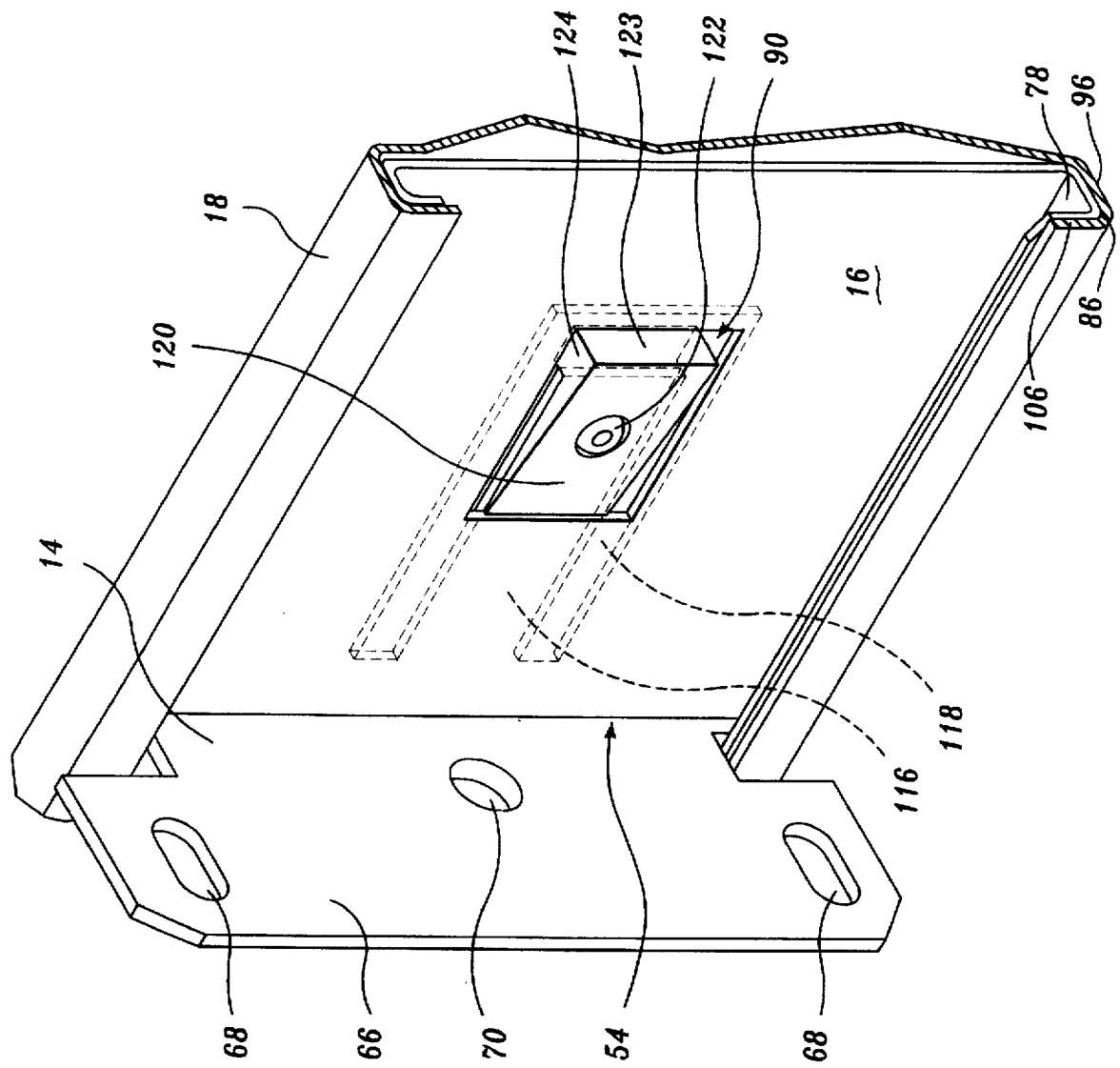
FIG. 5 is a cutaway perspective view of a portion of the integrated chassis slide assembly.

To withdraw the chassis 12 from between the fixed slides 14, the coupling screws 114 are loosened and the integrated chassis slides 18 are pulled forward away front the from edges 54 of the fixed slides. The integrated chassis slides 18 are slidably withdrawn to the point at which the locking tabs 116 protruding from the outside faces 104 of the integrated chassis slides emerge into the corresponding square holes 90 in the intermediate slides 16. As the integrated chassis slides are withdrawn, the triangular latches 120 fully snap into the square holes 90, thereby catching the intermediate slides 16 with the flat faces 123 of the triangular latches. As best illustrated in FIGS. 1 and 5, the locking tabs 116 thereby prohibit complete removal of the integrated chassis slides 18 and the associated chassis 12, unless the locking tabs 116 are depressed to allow the integrated chassis slides to be withdrawn beyond the intermediate slides. When all three sets of slides are operated in conjunction, the chassis 12 is permitted to be slidably moved from a position fully between the fixed slides 14 and within the mounting rack (not shown) to a position fully extended, whereby the entire chassis is positioned beyond the front edge 54 of the fixed slides, to a position ultimately completely removed from the mounting rack.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An integrated chassis slide assembly, integrated with a chassis and used with a mounting rack, comprising:
   (a) a fixed slide having front and back edges, top and bottom edges, and inside and outside faces;
   (b) at least one intermediate slide having front and back edges, top and bottom edges bent over and outward to form opposed U-shaped channels to slidably interlock with the top and bottom edges of the fixed slide to allow slidable movement of said intermediate slide along said fixed slide, and inside and outside faces, wherein the outside face of said intermediate slide abuts the inside face of said fixed slide; and
   (c) a side panel of the chassis forming a unitary one-piece integrated chassis slide, having front and back edges, top and bottom edges bent over and outward to form opposed U-shaped channels to slidably interlock with the U-shaped channels of the top and bottom edges of said intermediate slide to allow slidable movement of said integrated chassis slide along said intermediate slide, and inside and outside faces, wherein the outside face of the integrated chassis slide abuts the inside face of said intermediate slide.

2. The integrated chassis slide assembly of claim 1, wherein:
   (a) said fixed slide includes:
      (i) a mounting ear at the front edge of said fixed slide for mounting said fixed slide to the mounting rack and coupling said fixed slide to said integrated chassis slide; and
      (ii) an angled notched tab near the back edge of said fixed slide to restrict the slidable movement of said intermediate slide beyond the back edge of said fixed slide; p1 (b) said intermediate slide includes a step in at least one channeled edge that interacts with the mounting ear of said fixed slide to restrict the slidable movement of said intermediate slide away from the back edge of said fixed slide; and
   (c) said integrated chassis slide includes a coupling ear at the front edge of said integrated chassis slide for coupling said integrated chassis slide to the mounting ear of said fixed slide and restricting the slidable movement of said integrated chassis slide at the front edge of said intermediate slide as said integrated chassis slide moves toward the back edge of said fixed slide.

3. The integrated chassis slide assembly of claim 2, wherein:
   (a) said intermediate slide includes a hole centrally located near the front edge; and
   (b) said integrated chassis slide includes a locking tab formed by a notch cut into said integrated chassis slide, the notch having inside and outside faces corresponding to the inside and outside faces of said integrated chassis slide and a latch mounted on the outside face of the notch and abutting the inside face of said intermediate slide, shaped to fit and interlock with the hole of said intermediate slide at a point where the locking tab snaps into the hole, such that the slidable movement of said integrated chassis slide away from the back edge of said fixed slide is restricted beyond the point at which the locking tab snaps into the hole.

4. The integrated chassis slide assembly of claim 1, wherein:
   (a) said intermediate slide includes a hole centrally located near the front edge; and
   (b) said integrated chassis slide includes a locking tab formed by a notch cut into said integrated chassis slide, the notch having inside and outside faces corresponding to the inside and outside faces of said integrated chassis slide and a latch mounted on the outside face of the notch and abutting the inside face of said intermediate slide, shaped to fit and interlock with the hole of said intermediate slide at a point where the locking tab snaps into the hole, such that the slidable movement of said integrated chassis slide away from the back edge of said fixed slide is restricted beyond the point at which the locking tab snaps into the hole.

5. An improved chassis slide assembly, for use with a chassis and a mounting and a mounting rack, the chassis slide assembly comprising:
   (a) a fixed slide having front and back edges, top and bottom edges, and inside and outside faces;
   (b) at least one intermediate slide having front and back edges, top and bottom edges bent over and outward to form opposed U-shaped channels to slidably interlock with the top and bottom edges of the fixed slide to allow slidable movement of said intermediate slide along said fixed slide, and inside and outside faces, wherein the outside face of said intermediate slide abuts the inside face of said fixed slide; and
   (c) a side panel of the chassis forming a unitary one-piece integrated chassis slide, having front and back edges, top and bottom edges bent over and outward to form opposed U-shaped channels to slidably interlock with the U-shaped channels of the top and bottom edges of said intermediate slide to allow slidable movement of said integrated chassis slide along said intermediate slide, and inside and outside faces, wherein the outside face of the integrated chassis slide abuts the inside face of said intermediate slide.

6. The improved chassis slide assembly of claim 5, wherein:
   (a) said fixed slide includes:
      (i) a mounting ear at the front edge of said fixed slide for mounting said fixed slide to the mounting rack and coupling said fixed slide to said integrated chassis slide; and
      (ii) an angled notched tab near the back edge of said fixed slide to restrict the slidable movement of said intermediate slide beyond the back edge of said fixed slide;

(b) said intermediate slide includes a step in at least one channeled edge that interacts with the mounting ear of said fixed slide to restrict the slidable movement of said intermediate slide away from the back edge of said fixed slide; and (c) said integrated chassis slide includes a coupling ear at the front edge of said integrated chassis slide for coupling said integrated chassis slide to the mounting ear of said fixed slide and restricting the slidable movement of said integrated chassis slide at the front edge of said intermediate slide as said integrated chassis slide moves toward the back edge of said front side.

7. The improved chassis slide assembly of claim 6, wherein:

(a) said intermediate slide includes a hole centrally located near the front edge; and (b) said integrated chassis slide includes a locking tab formed by a notch cut into said integrated chassis slide, the notch having inside and outside faces corresponding to the inside and outside faces of said integrated chassis slide and a latch mounted on the outside face of the notch and abutting the inside face of said intermediate slide, shaped to fit and interlock with the hole of said intermediate slide at a point where the locking tab snaps into the hole, such that the slidable movement of said integrated chassis slide away from the back edge of said fixed slide is restricted beyond the point at which the locking tab snaps into the hole.

8. The improved chassis slide assembly of claim 5 wherein:

(a) said intermediate slide includes a hole centrally located near the front edge; and (b) said integrated chassis slide includes a locking tab formed by a notch cut into said integrated chassis slide the notch having inside and outside faces corresponding to the inside and outside faces of said integrated chassis slide and a latch mounted on the outside face of the notch and abutting the inside face of said intermediate slide, shaped to fit and interlock with the hole of said intermediate slide at a point where the locking tab snaps into the hole, such that the slidable movement of said integrated chassis slide away from the back edge of said fixed slide is restricted beyond the point at which the locking tab snaps into the hole.

9. An integrated chassis slide assembly, integrated with a chassis and used with a mounting rack, comprising:

(a) a fixed slide, having front and back edges, top and bottom edges, and inside and outside faces, wherein said fixed slide includes:

(i) a mounting ear at the front edge of said fixed slide for mounting said fixed slide to the mounting rack; and (ii) an angled notched tab near the back edge of said fixed slide to restrict the slidable movement of said intermediate slide beyond the back edge of said fixed slide;

(b) at least one intermediate slide, having front and back edges, top and bottom edges bent over and outward to form opposed U-shaped channels to slidably interlock with the top and bottom edges of said fixed slide to allow slidable movement of said intermediate slide along said fixed slide, and inside and outside faces, wherein the outside face of said intermediate slide abuts the inside face of said fixed slide, wherein said intermediate slide includes:

(i) a step in at least one channeled edge that interacts with the mounting ear of said fixed slide to restrict the slidable movement of said intermediate slide away from the back edge of said fixed slide; and (ii) a hole centrally located near the front edge; and (c) an integral chassis slide, forming a side panel of the chassis, having front and back edges, top and bottom edges bent over to form opposed U-shaped channels to slidably interlock with the U-shaped channels of the top and bottom edges of said intermediate slide to allow slidable movement of said integrated chassis slide along said intermediate slide, and inside and outside faces, wherein the outside face of said integrated chassis slide abuts the inside face of said intermediate slide, wherein said integrated chassis slide includes:

(i) a coupling ear at the front edge of said integrated chassis slide for coupling said integrated chassis slide to the mounting ear of said fixed slide and restricting the slidable movement of said integrated chassis slide at the front edge of said intermediate slide as said integrated chassis slide moves toward the back edge of said fixed slide; and (ii) a locking tab formed by a notch cut into said integrated chassis slide, the notch having inside and outside faces corresponding to the inside and outside faces of said integrated chassis slide and a latch mounted on the outside face of the notch and abutting the inside face of said intermediate slide at a point where the locking tab snaps into the hole, shaped to fit and interlock with the hole of said intermediate slide such that the slidable movement of said integrated chassis slide away from the back edge of said fixed slide is restricted beyond the point at which the locking tab snaps into the hole.

\* \* \* \* \*

UNITED STATES PATENT AND TRADEMARK OFFICE
CERTIFICATE OF CORRECTION

PATENT NO. : 5,626,406
DATED : May 6, 1997
INVENTOR(S) : H. Schmid

It is certified that error appears in the above-indentified patent and that said Letters Patent is hereby corrected as shown below:

| COLUMN | LINE | ERROR |
|---|---|---|
| 7 (Claim 2, | 59 line 11) | After "slide" delete "p1" |
| 7 (Claim 2, | 59 line 11) | Begin new subparagraph with "(b) said intermediate slide . . ." to line up vertically under "(a)" |
| 8 (Claim 5, | 35 line 2) | Delete "and a mounting" (second occurrence) |
| 9 (Claim 8, | 35 line 6) | After "slide" insert --,-- |

Signed and Sealed this

Nineteenth Day of August, 1997

*Attest:*

BRUCE LEHMAN

*Attesting Officer*     *Commissioner of Patents and Trademarks*